United States Patent [19]

Taralp

[11] 4,156,173
[45] May 22, 1979

[54] INPUT IMPEDANCE MATCHING OF A BIPOLAR TRANSISTOR EMPLOYING A COAXIAL TRANSFORMER

[75] Inventor: Guner Taralp, Ottawa, Canada
[73] Assignee: Northern Telecom Limited, Montreal, Canada
[21] Appl. No.: 842,385
[22] Filed: Oct. 17, 1977
[51] Int. Cl.² .................................................. G05F 1/56
[52] U.S. Cl. ........................................ 323/17; 307/275; 307/296 A; 333/32; 336/84 R
[58] Field of Search ................. 323/17, DIG. 1, 22 T; 336/82, 84 R; 307/275, 296; 330/293; 333/32

[56] References Cited

U.S. PATENT DOCUMENTS

| | | | |
|---|---|---|---|
| 2,655,623 | 10/1953 | Parker | 336/82 |
| 3,353,130 | 11/1967 | Silverstein | 336/82 |
| 3,435,361 | 3/1969 | Van Doorn | 330/293 |
| 3,473,136 | 10/1969 | Akiyama et al. | 330/293 |
| 4,034,282 | 7/1977 | Renard | 323/DIG. 1 |

*Primary Examiner*—Gerald Goldberg
*Attorney, Agent, or Firm*—Robert C. Hogeboom

[57] ABSTRACT

A coaxial transformer is employed to provide impedance matching for the input of a bipolar transistor operated in the VHF frequency range. The coaxial transformer comprises a first winding wound around a ferrite toroidal core. The second winding has a single turn and consists of a metal enclosure substantially surrounding the first winding. One end of the first winding is connected to the base of the transistor and the other end of the first winding is connected to ground. One end of the second winding is connected to the emitter of the transistor and the other end of the second winding is connected to ground.

7 Claims, 5 Drawing Figures

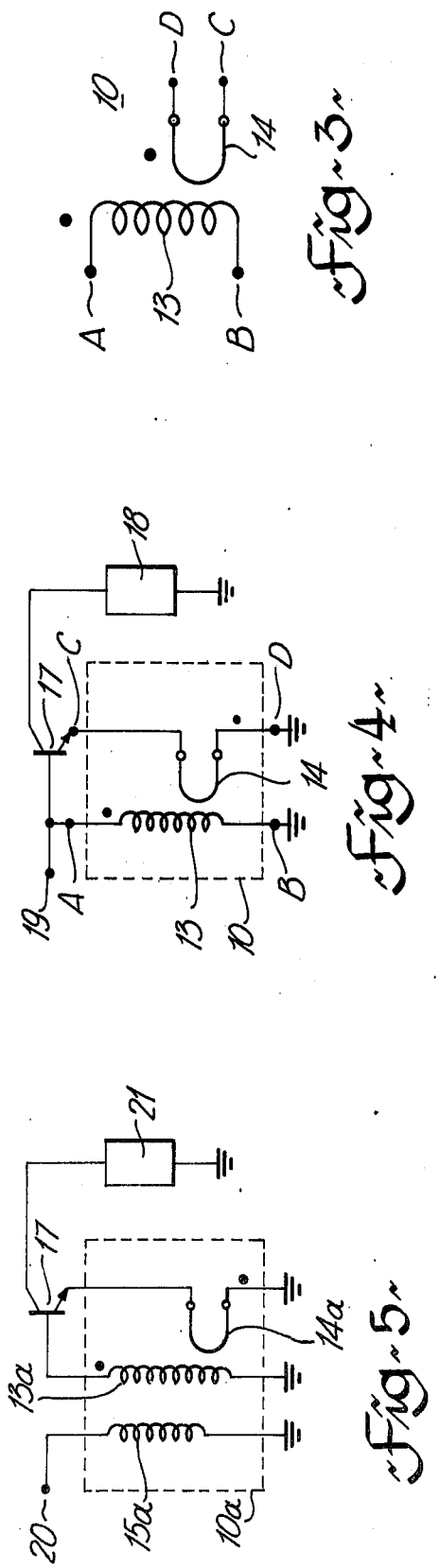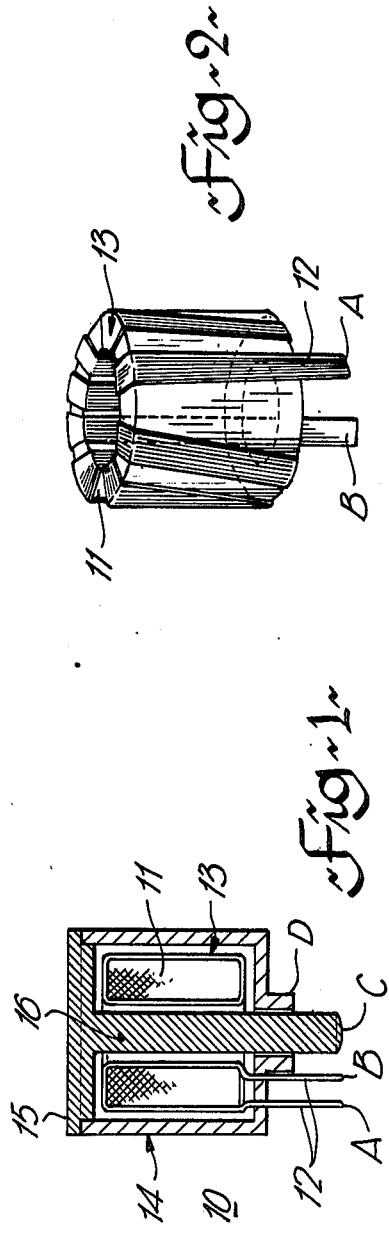

INPUT IMPEDANCE MATCHING OF A BIPOLAR TRANSISTOR EMPLOYING A COAXIAL TRANSFORMER

This invention relates to impedance matching, and more particularly to a circuit for matching the input impedance of a bipolar transistor to the impedance of associated equipment in the VHF frequency range.

A bipolar transistor is a three terminal device, the terminals being namely: the base; the collector; and the emitter. The input impedance of the base port, id est, $h_{ie}$, is generally of a relatively high magnitude (relative to 50 ohms), and capacitive. The input impedance of the emitter port, id est, $h_{ib}$, is generally of a low impedance (relative to 50 ohms) and is inductive. The impedance of the collector port will not be discussed.

For work in the VHF frequency range an impedance of 50 ohms is commonly used. Consequently, it is desirable to match the input impedance of a bipolar transistor to a 50 ohm network. As stated previously, the input impedances of the base and emitter are other than 50 ohm, and are other than resistive. Consequently, some way must be found to ensure a good impedance match between the input of the transistor and the associated cable or network connected to that transistor. It should be noted here, that as is well known in the art, it is desirable for the input impedance of the transistor to be equal to the impedance of the network with which it is associated.

In the prior art, various ways have been used to match impedances. Coils, capacitors, resistors, and transformers have been connected, either individually or in some combination, and in some fashion, between the transistor input and its associated circuitry.

The present invention is directed to an improved means of matching of input impedance of a bipolar transistor to its associated circuitry. In order to do this a special transformer is employed. This specific transformer comprises a toroidal core wound with a first winding. The toroidal core is contained completely within an outer casing which also serves as a single turn second winding. A transformer of this general construction will be referred to herein as a "coaxial" transformer and will be discussed later, in greater detail. One prior art transformer of this general type is depicted in U.S. Pat. No. 3,353,130 dated Nov. 14, 1967 to A. Silverstein.

According to the present invention, one end of the first winding is connected to the base of the bipolar transistor, one end of the second winding is connected to the emitter of the bipolar transistor, and the remaining ends of the first and second windings are joined together and are connected to ground. When the desired input signal is applied to the base of the transistor, a satisfactory impedance match can be had in some circumstances. However, depending upon the circuit parameters, a satisfactory impedance match may not always be had, and it will be necessary to then employ the second embodiment of this invention.

In a second embodiment of the present invention, a third winding, similar to the first winding is wound on the toroidal core. The desired input signal is then applied to one end of this third winding, and the remaining end of the third winding is connected to ground. The remainder of the structure of this second embodiment, and its connection to the transistor, is identical to that of the first embodiment, described previously.

In other terms, the present invention is the combination of a bipolar transistor and a coaxial transformer, the combination characterized by: the transformer having a first winding and a second winding, and the impedance transformation ratio of the two windings being 25 to 1 or greater; the first winding comprising a ribbon wire wound around a toroidal ferrite core; the second winding of the transformer comprising a metal container which forms a single turn around the first winding, and substantially surrounds the first winding; the transformer having one end of the first winding connected to the base of the transistor and the other end of the first winding connected to ground; the second winding having one end connected to the emitter of the transistor and the other end of the second winding connected to ground; and a load connected between the collector of the transistor and ground.

The present invention will now be described in more detail with reference to the accompanying drawings, wherein like parts in each of the several figures are identified by the same reference character, and wherein:

FIG. 1 is a longitudinal section of the coaxial transformer employed with the present invention;

FIG. 2 is a perspective view of the toroidal core and one winding of the coaxial transformer of FIG. 1;

FIG. 3 is a schematic drawing of the transformer of FIG. 1;

FIG. 4 is a simplified schematic of one embodiment of the present invention;

FIG. 5 is a simplified schematic of another embodiment of the present invention.

Before the invention itself is described, the coaxial transformer which forms an integral part of the invention will be described. FIG. 1 depicts a longitudinal section of coaxial transformer 10. Transformer 10 comprises a toroidal ferrite core 11 around which a ribbon wire 12 is wound to form a first winding 13 of transformer 10. Completely surrounding core 11 and winding 13 is a second winding 14 which is essentially an electrically conductive shell 15 with a central leg portion 16 which forms a coaxial structure from which the term coaxial transformer arises. Shell 15 is made of metal, for example, copper. Winding 13 has two ends indicated as A and B which exit shell 15 via a small opening. One end of central leg portion 16, indicated by the reference character C, forms one end of second winding 14 and one end of conductive shell 15, indicated generally by the reference character D, forms the other end of winding 14. The end C of leg portion 16 passes through an opening defined by end D of shell 15, without making contact therewith.

FIG. 2 shows in somewhat more detail the core 11 and winding 13. Winding 13 is wound as shown in the Figure and is formed of ribbon wire 12. Ribbon wire 12 consists of several wires (e.g. six) parallel to each other and insulated from each other along their entire lengths, except for their extremities. At one extremity, eg. at end A, all the conductors of ribbon wire 12 are in electrical contact with each other. Similarly, at end B, all the conductors of ribbon wire 12 are in electrical contact with each other. In other words, each conductor in ribbon wire 12 is in parallel with every other conductor in wire 12. Transformer 10 has an extremely high impedance transformation ratio (25:1 or greater).

FIG. 3 is a schematic representation of transformer 10. It is believed that FIG. 3 is self-explanatory.

FIG. 4 is a simplified schematic of one preferred embodiment of the present invention. Transistor 17 has its base connected to end A of winding 13, and end B of winding 13 is connected to ground potential. The emitter of transistor 17 is connected to end C of winding 14, and end D of winding 14 is connected to ground potential. The collector of transistor 17 is connected to one end of a load 18, the other end of load 18 being connected to ground potential. The incoming signal to the circuit is applied to terminal 19.

Because of the use of coaxial transformer 10 with transistor 17 (as depicted in FIG. 4) the capacitive high impedance (of the base of transistor 17) and the inductive low impedance (of the emitter of transistor 17) are combined into a resistive medium with a magnitude intermediate the impedance magnitude of the base and emitter. Additionally, the device of FIG. 4 is for all intensive purposes unilateralized. Because the effects of collector current and collector voltage are divided between the emitter and the base of transistor 17, cancellation of feedback is achieved. This, consequently, results in stable operation of transistor 17.

Depending upon the circuit parameters, transformer 10 of FIG. 4 may not adequately match the input impedance of transistor 17 to its associated circuitry. If such is the case, then the circuit of FIG. 5 can be used to perform the matching functions, since the FIG. 5 circuit can match over a broader impedance range than can the circuit of FIG. 4.

FIG. 5 depicts transistor 17 connected to a coaxial transformer 10a. Coaxial transformer 10a is identical to transformer 10 (of FIG. 4), except for an additional third winding 15a. Winding 13a of transformer 10a is identical to winding 13 of transformer 10; and winding 14a of transformer 10a is identical to winding 14 of transformer 10. Winding 15a of transformer 10a is wound in a similar fashion to winding 13a, but the number of turns in winding 15a is dependent upon the impedance match desired, as is well known in the art. A load 21 is connected between the collector of transistor 17 and ground, and the input signal to the circuit is applied to terminal 20.

Transformer 10 of FIG. 4 has the following characteristics:
(a) impedance of winding 13 is 50 ohms (at a frequency of 140 MHz);
(b) impedance of winding 14 is 1.4 ohms (at a frequency of 140 MHz);
(c) outside diameter of shell 15 is 8.0 mm;
(d) outside height of shell 15 is 10.0 mm;
(e) wire for winding 13 is #34 gauge enamel wire with 6 conductors arranged in parallel;
(f) number of turns of winding 13 is six;
(g) frequency of operation is 50 MHz to 250 MHz;
(h) core 11 is comprised of three toroids stacked one above the other (Indiana General ferrite toroids #CF101);
(i) transformer 10 has a 36:1 impedance transformation ratio;
(j) transistor 17 is a Siemens #BFT 66 NE.

Transformer 10a of FIG. 5 has similar characteristics as transformer 10, but it has an additional winding 15a wound so as to present a predetermined impedance.

What is claimed is:

1. The combination of a bipolar transistor and a coaxial transformer, said combination characterized by:
said transformer having a first winding and a second winding, and the impedance transformation ratio of said two windings being 25 to 1 or greater;
said first winding comprising a ribbon wire wound around a toroidal ferrite core;
said second winding of said transformer comprising a metal container which forms a single turn around said first winding, and substantially surrounds said first winding;
said transformer having one end of said first winding connected to the base of said transistor and the other end of said first winding connected to ground;
said second winding having one end connected to the emitter of said transistor and the other end of said second winding connected to ground; and
a load connected between the collector of said transistor and ground.

2. The combination of claim 1 wherein said second winding is made of copper.

3. The combination of claim 2 further including a third winding, similar in construction to said first winding and sharing the same core as said first winding.

4. The combination of claim 2 wherein the frequency of operation is 50 MHz to 250 MHz.

5. The combination of claim 1 further including a third winding, similar in construction to said first winding and sharing the same core as said first winding.

6. The combination of claim 5 wherein the frequency of operation is 50 MHz to 250 MHz.

7. The combination of claim 1 wherein the frequency of operation is 50 MHz to 250 MHz.

* * * * *